(12) United States Patent
Ramsey

(10) Patent No.: US 10,374,572 B2
(45) Date of Patent: Aug. 6, 2019

(54) RADIOFREQUENCY FILTER WITH IMPROVED ATTENUATION OF COMMON MODE SIGNALS

(71) Applicant: John Gordon Ramsey, Pittsford, NY (US)

(72) Inventor: John Gordon Ramsey, Pittsford, NY (US)

(*) Notice: Subject to any disclaimer, the term of this patent is extended or adjusted under 35 U.S.C. 154(b) by 12 days.

(21) Appl. No.: 15/727,582

(22) Filed: Oct. 7, 2017

(65) Prior Publication Data

US 2018/0109041 A1   Apr. 19, 2018

Related U.S. Application Data

(60) Provisional application No. 62/408,467, filed on Oct. 14, 2016.

(51) Int. Cl.
| | |
|---|---|
| *H03H 7/42* | (2006.01) |
| *H03H 7/09* | (2006.01) |
| *H01R 13/659* | (2011.01) |
| *H01P 1/22* | (2006.01) |
| *H03H 7/00* | (2006.01) |
| *H05K 9/00* | (2006.01) |
| *H04B 15/02* | (2006.01) |
| *H03H 1/00* | (2006.01) |
| *H01P 1/207* | (2006.01) |

(52) U.S. Cl.
CPC ............ *H03H 7/427* (2013.01); *H01P 1/225* (2013.01); *H01R 13/659* (2013.01); *H03H 7/00* (2013.01); *H03H 7/09* (2013.01); *H05K 9/0066* (2013.01); *H05K 9/0069* (2013.01); *H01P 1/207* (2013.01); *H03H 1/0007* (2013.01); *H04B 15/02* (2013.01)

(58) Field of Classification Search
CPC ......... H03H 7/09; H03H 7/427; H03H 1/0007
USPC .................................................. 333/181, 185
See application file for complete search history.

(56) References Cited

U.S. PATENT DOCUMENTS

| | | | | |
|---|---|---|---|---|
| 5,594,200 A | * | 1/1997 | Ramsey ............... | H05K 9/0007 174/382 |
| 9,490,766 B2 | * | 11/2016 | Kisner ................. | H03H 1/0007 |
| 2004/0085157 A1 | * | 5/2004 | Richardson .......... | H01R 13/719 333/181 |
| 2005/0057396 A1 | * | 3/2005 | Boyanov .............. | H01Q 9/0407 343/700 MS |
| 2015/0021983 A1 | * | 1/2015 | Karimi ................. | B60R 16/033 307/9.1 |

(Continued)

*Primary Examiner* — Rakesh B Patel
(74) *Attorney, Agent, or Firm* — Patent Technologies, LLC; Robert D. Gunderman, Jr.

(57) ABSTRACT

A radiofrequency filter utilizing a common mode choke both as a traditional common mode choke as well as the inductance in a low pass filter. Filter topology as well as component selection is optimized for wide band operation. Common mode chokes allow differential currents to pass with little attenuation while common mode currents are effectively presented with an inductance in the common current path. This inductance is used in a low pass filter configuration to present an even higher attenuation to common mode currents. The use of multiple chokes and/or differing core materials contributes to wider band operation without pronounced resonances. The capacitance used in the low pass filter is connected in a way as to reduce its effect on the data signals while still being effective in filtering.

18 Claims, 14 Drawing Sheets

(56) References Cited

U.S. PATENT DOCUMENTS

2015/0280682 A1* 10/2015 Park .................. H01F 27/24
                                                    361/220
2017/0345560 A1* 11/2017 Tomonari ............ H01F 27/29

* cited by examiner

RADIOFREQUENCY FILTER WITH IMPROVED ATTENUATION OF COMMON MODE SIGNALS

CROSS-REFERENCE TO RELATED PATENT APPLICATIONS

This application claims priority to U.S. Patent Application Ser. No. 62/408,467 filed Oct. 14, 2016 entitled "Radiofrequency Filter With Improved Attenuation of Common Mode Signals" by John Gordon Ramsey, the entire disclosure of which is incorporated herein by reference.

BACKGROUND OF THE INVENTION

1. Field of the Invention

The present invention relates to radiofrequency filters, and more particularly, relates to a radio frequency filter with improved attenuation of common mode signals.

2. Description of Related Art

The present invention relates to radiofrequency (RF) filters for data signal lines, particularly high speed differential data signaling such as used in USB3 and HDMI devices. In one example, the present invention is used in RF filtering of interface cables used when connecting to wireless devices being tested in a shielded RF test enclosure. A typical RF shielded test enclosure is described in U.S. Pat. No. 5,594,200 to Ramsey and U.S. Pat. No. 8,294,044 also to Ramsey, the entire disclosure of both of these United States Patents being incorporated herein by reference in their entirety.

RF filters can be used to remove or suppress interfering radio frequency signals on conductor lines. The need for such filters is readily apparent when a device is being tested in an environment where there may be other RF signals which are not part of the test and their radiation may disturb the test or influence measurements. A shielded test enclosure chamber provides a nearly 'sterile' RF environment in which to test a device, but the problem of how to electronically connect to the device inside the chamber without allowing stray RF signals to interfere is an issue. If the connections to the device are relatively low frequency, and the potential interfering signals are higher frequency, simple RF low pass filters may be used to pass the low frequency connection signals while attenuating the higher frequency interfering signals. For example, a typical WiFi device may operate at 2.4 GHz, while the data connection to it may be 10 MHz Ethernet. In this case a low pass filter with a cutoff above the Ethernet data connection frequency but below the 2.4 GHz WiFi will allow desired signals to pass and undesired signals to be stopped. As data speeds increase, there are instances where the data signal frequencies may fall within the RF wireless frequencies. In these cases, there is no way to filter out the data from the interfering signals as they both fall within the same general frequency range.

Common mode chokes have been used extensively in a variety of configurations on data lines as well as power supply conductors and connections. In these cases, the choke is used to limit radiated RF from the device to its surroundings, in order to meet various RF interference limits set by regulatory entities. The common mode choke is effective in mitigating such RF interference due to its construction. The design of the common mode choke has parallel conductors wound on a common core material so that the magnetic field from one conductor interacts with the magnetic field of the other conductor. If the currents in each conductor are equal but 180 degrees out of phase, the magnetic fields effectively cancel, producing little effect on the conductors; this is termed differential mode. However, if the currents on the conductors are in phase, the magnetic fields add and produce a net inductance in series with the conductors; this is termed common mode. This common mode inductance can be used as a component in a low pass configuration with a roll off of 6 db per octave in frequency. The inductance presented is governed by the number of turns the conductor is wound around (or through) the core as well as the selection of core material. Proper selection of core material and design of the conductor windings has great effect on self-resonances; these characteristics can be used to modify to a positive degree the overall filtering effect.

Those skilled in the art will realize that the addition of a shunt capacitance with the series inductance increases the roll off from 6 db per octave to 12 db per octave, changing the filter from a first order to second order low pass filter. Clearly, the addition of additional shunt capacitance or additional series inductance will result in higher order filtering and additional filtering effect. The addition of shunt capacitance on the signal lines can have a negative effect on the signal fidelity, especially with higher speed signals where this capacitance will affect the phase and amplitude of the signal. It is thus one object of this invention to minimize such detriments to the signal while still enhancing the filtering effect on undesired signals.

BRIEF SUMMARY OF THE INVENTION

A radiofrequency filter is provided that comprises a novel common mode choke arrangement that is used as both a traditional common mode choke as well as the inductance in a low pass filter. The inductance in the current path is used in a low pass filter configuration to present an even higher attenuation to common mode currents. The low pass filter is capacitively configured to reduce negative effects on data signals while still being effective at filtering. Multiple chokes and in some embodiments differing core materials for the chokes provide for wider band operation without pronounced resonances.

The foregoing paragraph has been provided by way of introduction, and is not intended to limit the scope of the invention as described herein.

BRIEF DESCRIPTION OF THE DRAWINGS

The invention will be described by reference to the following drawings, in which like numerals refer to like elements, and in which.

Figure 1:
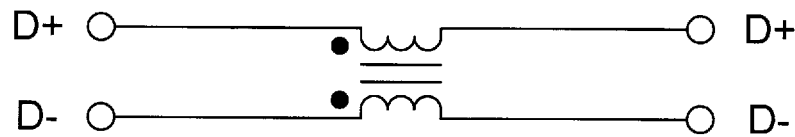
FIG. 1 shows use of a common-mode choke on data signal lines.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by this specification, claims and drawings provided herein.

DESCRIPTION OF THE PREFERRED EMBODIMENTS

For a general understanding of the present invention, reference is made to the drawings. In the drawings, like reference numerals have been used throughout to designate identical elements.

FIG. 1 shows use of a conventional common-mode choke on data signal lines. The choke has two windings, each closely coupled and wound on a magnetic core, such a winding is usually called a Bifilar winding, indicating its balanced nature. Such core material may be iron, ferrite or other such material. It is noted that different core materials may have certain advantages at various frequencies, currents and other factors. In the embodiment of this invention, core material is selected mainly in conjunction with frequency of operation. Further, in this example provided, attenuation is −6 db./octave.

Figure 2:
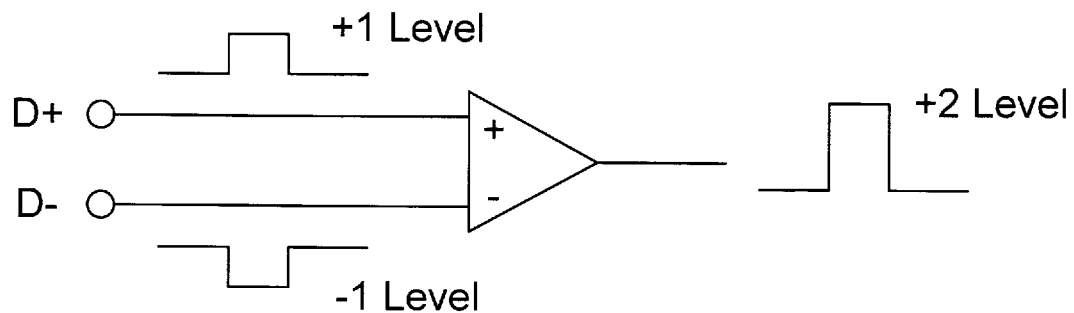
FIG. 2 shows the basics of Differential Signaling.

FIG. 2 shows the basics of conventional Differential Signaling. Differential signaling is a method for electrically transmitting information using two complementary signals. The technique sends the electrical signal as a differential pair of signals, each on its own conductor. It is important that the conductor pairs be closely aligned so that any impairment or influence on either conductor is the same as the other in order to maintain symmetry of the differential signals. The receiving circuit responds to the electrical difference between the two signals, rather than the difference between a single wire and ground. Because of the nature of the receiving circuit, only differential signals will be produced at the output. If the receiving circuit is presented with the same signal at each differential input, the signals will cancel, thus producing no output. In the example depicted in FIG. 2, the input signal D− is inverted and added to the D+ input, resulting in an output at a +2 level. In this example, D− is the exact inverse of D+.

Figure 3:
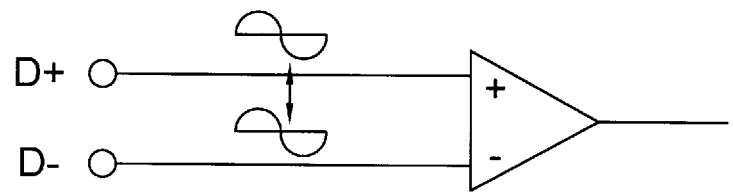
FIG. 3 shows how common mode signals are effectively cancelled by a differential receiver.

FIG. 3 shows how common mode signals are effectively cancelled by the differential receiver. The same signal, in this example a sinusoidal signal, applied to each input (D+ and D−) causes a cancellation at the output.

Figure 4A:
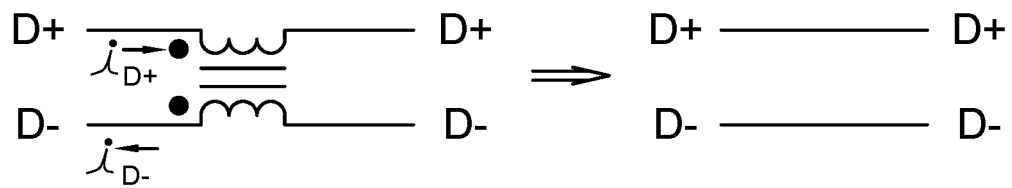
FIG. 4A illustrates how the inductances in a common mode choke appear to differential mode signal currents.
Figure 4B:
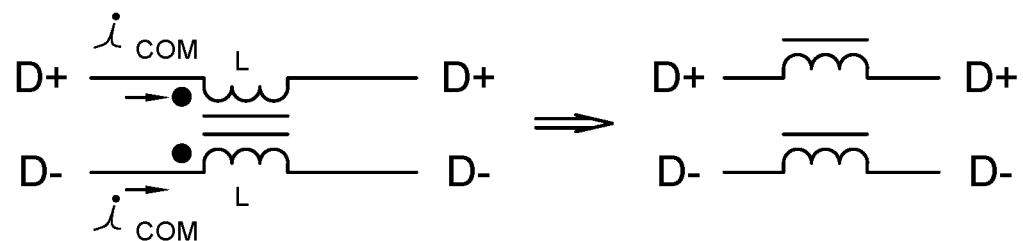
FIG. 4B illustrates how the inductances in a common mode choke appear to common mode signal currents.

FIGS. 4A and 4B illustrate how the inductances in a common mode choke appear to both common mode and differential mode signal currents. Magnetic flux in the core caused by differential mode current cancels and little impedance is produced, while common mode currents add, producing a magnetic flux and an impedance. Differential mode signals thus pass through the windings with little effect from the core, while common mode signals encounter an impedance produced from the magnetic flux in the core. FIG. 4A thus illustrates how the inductances in a common mode choke appear to differential mode signal currents where the inductances cancel since the currents cancel. FIG. 4B illustrates how the inductances in a common mode choke appear to common mode signal currents where the inductances add since the currents add.

Figure 5:
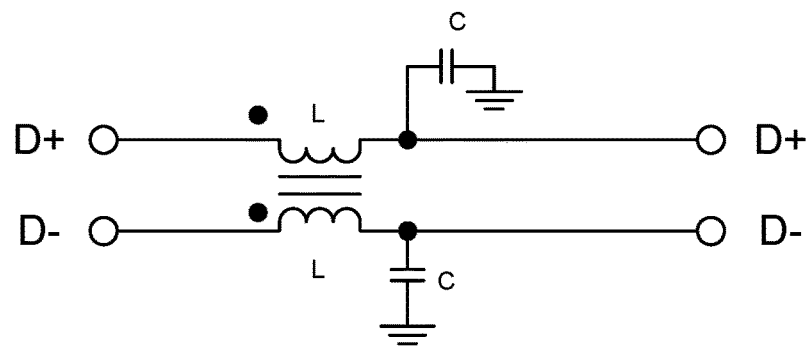
FIG. 5 depicts the 'Basic Improved Design' with a single choke.

FIG. 5 shows the 'Basic Improved Design' with a single choke. Capitalizing on the impedance produced by common mode signals (as explained by way of FIGS. 4A and 4B), it is used as the inductance in a simple two pole filter topology. The inductance and the added capacitance function as a low pass filter with a −12 dB/octave roll off in this example. In this example, addition of the capacitor adds another pole to the low pass response.

Figure 6:
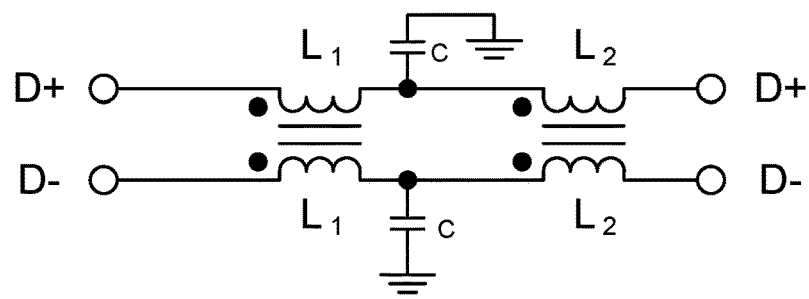
FIG. 6 depicts the 'Basic Improved Design' with dual chokes.

FIG. 6 shows the 'Basic Improved Design' with dual chokes. The use of an additional choke adds another pole of inductance to the low pass filter, thus producing a 3 pole low pass filter with −1 MB/octave roll off. Careful selection of chokes can be used to limit any self resonance effects of the chokes with respect to frequency. The use of differing chokes and core material can be used to broaden bandwidth and smooth the filter's response.

Figure 7:
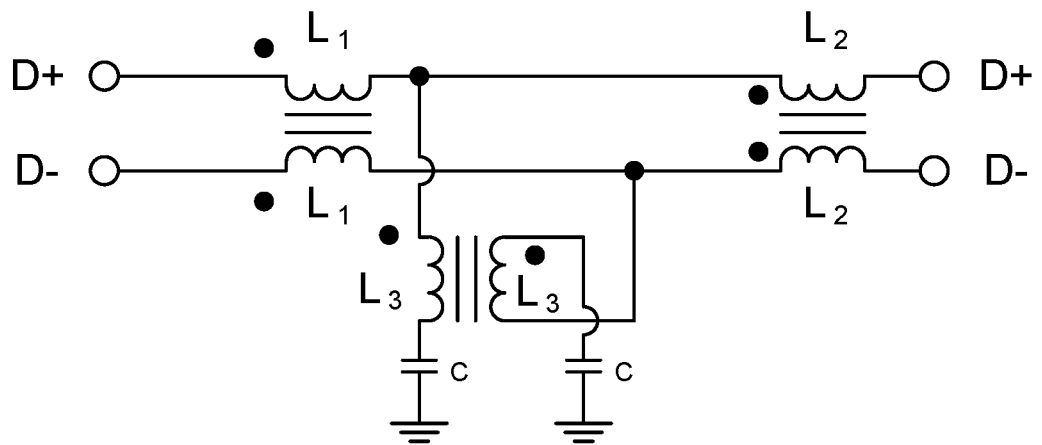
FIG. 7 depicts the 'Basic Improved Design' with a common mode capacitor 'lift'.

FIG. 7 shows the 'Basic Improved Design' with the dual chokes of FIG. 6, but with the addition of a choke in series with the capacitors to ground. This choke $L_3$ (choke 3) is phased to make the capacitor's effect appear as a high impedance to the differential mode signal but to appear as low impedance to the common mode signal, providing in a sense differential mode capacitor "lift" above ground. Once again, careful selection of chokes and capacitance can be used to affect filtering and data response.

Figure 8:
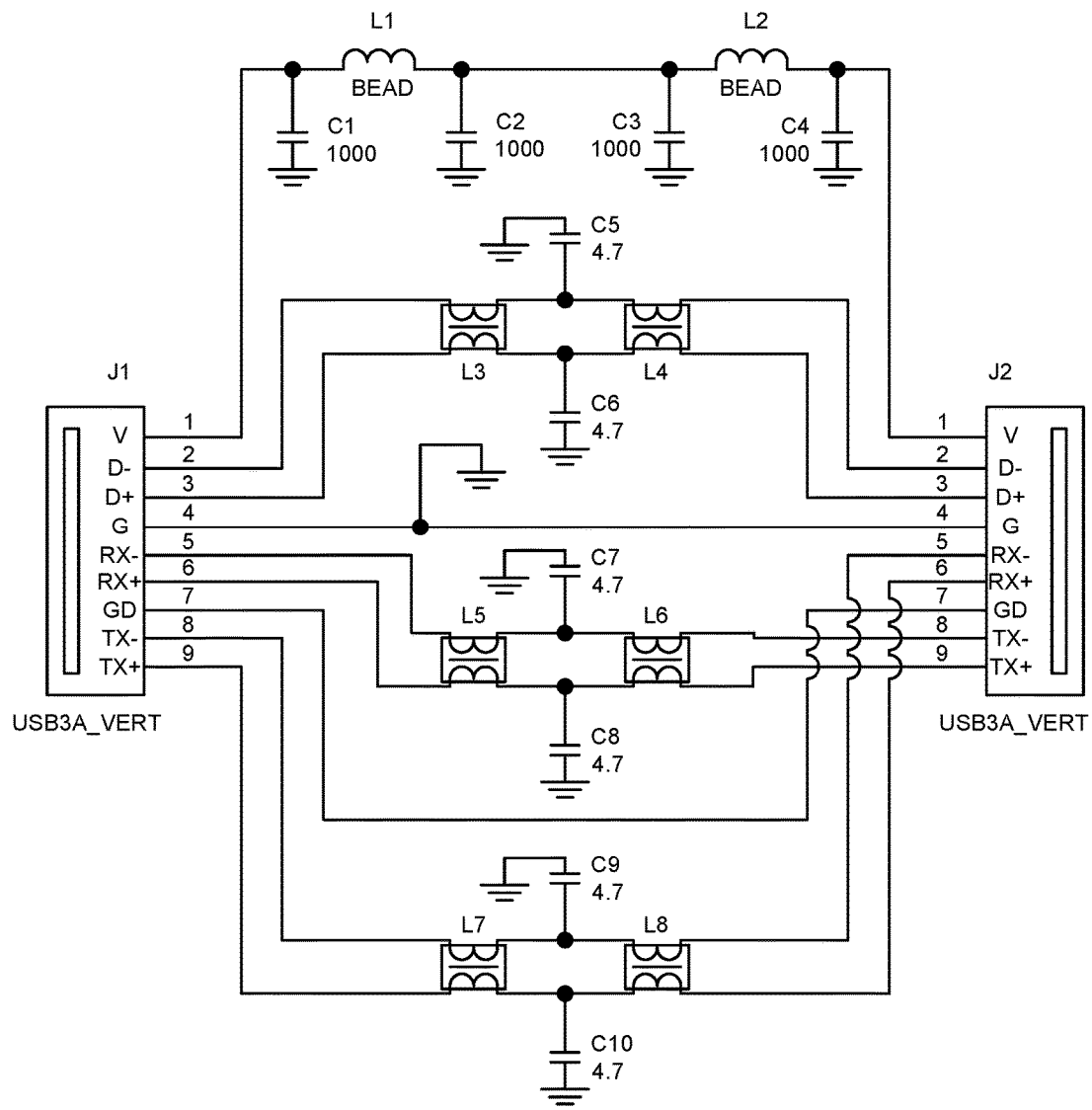
FIG. 8 depicts a preferred embodiment of the invention as applied to a USB 3 filter.

FIG. 8 shows a preferred embodiment of the invention as applied to a USB 3 filter. Common mode choke filtering as described in the present invention is present in three of the data signaling lines, while low pass filtering is used on the DC power supply line, as is evident in the schematic diagram provided in FIG. 8.

The present invention is an unexpected improvement on common mode choke filtering as used on differential signaling data lines. Differential data signaling lines are used in a multitude of formats such as USB, HDMI, PCI Bus and other high speed serial interfaces. Differential signaling is a method for electrically transmitting information using two complementary signals. The technique sends the same electrical signal as a differential pair of signals, each on its own conductor. The receiving circuit responds to the electrical difference between the two signals, rather than the difference between a single conductor and ground. In order for the differential signal to be properly recovered, each signal conductor must be as close to identical as the other in order to maintain the same propagation characteristics. In practice, bifilar conductors are generally used and may be unshielded (such as the twisted pairs in a CAT-5 Ethernet cable, or even a 'balanced' audio line such as a common wired telephone line) or shielded as found in higher speed Ethernet, USB or HDMI cables. The point being that each conductor in the bifilar arrangement is coupled to its partner conductor and near identical in propagation characteristics.

The property of the data signal lines being coupled closely also implies that any external interfering signal will be induced into both conductors equally, forming a common mode current which can be attenuated by the common mode choke.

The following background of filtering as it relates to passing data signals into and out of an RF Shielded environment such as an RF shielded test enclosure is presented to provide a complete understanding of the present invention and the various embodiments described, depicted, and envisioned herein.

Electromagnetic reception and/or transmission are an important function of many devices, for example, portable pagers, cellular telephones, notebook computer wireless modems, and the like. Similarly, many sensitive electronic devices may be susceptible to electromagnetic signals and need to be shielded from such signals when under test. Testing, tuning, and repair of such a device can require that the device under test (DUT) be isolated from ambient electromagnetic radiation. This is sometimes necessary to permit exposing a receiving device to an unambiguous test signal free from electromagnetic interference, or to obtain a corresponding clean signal from a transmitting device. Typically, a device to be tested is placed inside an electromagnetic isolation (EMI) chamber, sometimes also known as a Faraday cage or RF Shielded test enclosure, comprising a continuous shielded enclosure which prevents ingress or egress of electromagnetic radiation. Such a chamber may take the form of an entire room, known in the art as a "screen room" for its continuous screen shielding, wherein an operator testing a device may also be enclosed in the room with the device. Smaller shielded enclosures, also known as shielded boxes, capable of housing a DUT but not an operator, are disclosed, for example, in U.S. Pat. No. 4,884,171 to Maserang et al.; U.S. Pat. No. 5,136,119 to Leyland; and U.S. Pat. No. 5,171,936 to Suzuki et al; as well as U.S. Pat. Nos. 5,594,200, 8,294,044 and 9,497,894 each to Ramsey; the disclosures of each of these patents is incorporated herein by reference in their entirety.

In all cases, there exists a need to convey power or signaling data conductors across the RF shielded barrier in order to effect testing of the device within the shielded environment. The difficulty is that undesired RF interference may propagate along these conductors and, in turn, degrade the shielding effectiveness of the enclosure.

If the data signals are low in frequency in relation to the interfering signals, suitable low pass filters may be inserted on conductors which cross the shielding barrier. In this case, the low pass filter thus filters out the higher frequency interference, but allows the lower frequency power or data signals to pass through. As data speeds have increased, this filtering approach does not work since data signaling frequencies may now be within the pass band of the low pass filter. Indeed, differential data signaling rules on such cabling lies within many RF wireless frequencies. Common mode vs. differential mode becomes one of the only ways to distinguish between the desired data signals and the undesired interfering signals.

It is an object of the present invention to provide a filtering device that will reject common mode signals on a data line while passing, with as little distortion as possible, a differential signal. It is a further object of the invention to cover as wide a frequency range as possible for both the attenuation of common mode signals, and the faithful passage of differential data signals.

For maximum signal fidelity of the differential signals, each conductor should be identical and tightly coupled to its mate. Especially in the case of this invention, the differential pair of conductors is designed to be very tightly coupled and of an impedance equal to the accepted impedance of the cable. For example, USB 3 conductor impedance is approximately 90 ohms. Tight coupling of the conductors serves to keep the signal propagation contained between the two conductors and little affected by external influence such as the magnetic core(s) used on the filter. Self resonance is a common effect in RF chokes and various methods are used to limit these effects, such as winding technique, conductor size, and selection of core material. The use of two chokes with different windings or core material serves to move the self resonance frequencies apart from each other and broaden the frequency response overall. The junction between these different chokes is where a suitable capacitance may be added to effect another filtering pole for improved filtering of common mode signals. This capacitance is selected to minimize differential signal degradation due to the choke's leakage inductance, while still adding in a filtering pole in the common mode signal path where the choke's inductance is far greater. This capacitance may be of the form of a lumped component, a Printed Circuit Board (PCB) pad or trace area, or a microstripline conductor trace.

In the preferred embodiment, a circuit topology such as FIG. 8 is used. Two chokes are used, each with a different core material, type 43 and type 61 ferrite bead material. The type 43 material is preferred for frequencies in the HF to VHF frequency range while the type 61 material is preferred for VHF to UHF frequencies.

The bifilar windings on each choke are constructed of enameled magnet wire which is tightly twisted to present a nominal 90 ohm balanced line impedance, in accordance with USB 3 specifications. Each core is wound with three turns of the bifilar conductor with attention paid to keeping each conductor in the pair equal length, lead dress similar, and windings spaced equally on the core. In short, each conductor in the bifilar is as close as possible, the equal of the other. In other embodiments, there may be 1, 2, 3 or more turns through the core. The circuit path between the chokes is a small microstripline with exaggerated pad area to serve as the capacitances "C" as found in FIG. 6. Alternatively, these pad areas can be adjusted in size for capacitance or be used as connection points for lumped capacitors such as SMT style chip capacitors. It has been found that a capacitance of 4.7 pf works well in this embodiment of the invention.

In the instance where a greater amount of low frequency filtering is required, these capacitances, 'C' should be made greater, however large capacitances can affect high frequency data signals. As indicated in FIG. 7, the addition of another choke, but phased differently from the chokes in the data signal path, can be used to effectively add this capacitance. Due to this phasing connection, the differential data signals are canceled while the common mode signal is not. This has the effect of the additional capacitance not 'appearing' to the differential data signal, but the common mode signal 'seeing' this capacitance. It has been found that capacitance values multiple times higher can be used in this configuration.

Described above is a single common mode filter as used on one data signaling line. In practice, many protocols use multiple differential signaling lines in one cable assembly; USB 3 uses a total of three—including legacy USB 2 signals, while HDMI uses five or more signaling lines in one cable. Clearly, one would use multiples of the basic FIG. 6 circuit on each differential data signal line. Additionally, there may be extra conductors within each cable for low speed data, power or control signals. Since these are not either differential or high speed, normal low pass filtering may be used on these lines and is not part of the invention. A functional USB3 filter is shown in FIG. 8 which also shows the additional low frequency filtering on the power conductors.

In some embodiments of the present invention, the radiofrequency filter utilizes a common mode choke both as a traditional common mode choke as well as the inductance in a low pass filter.

In some embodiments of the present invention, the radiofrequency filter utilizes a multitude of common mode chokes, each with different characteristics to effect a wider and flatter band of filtering across frequencies.

In some embodiments of the present invention, the radiofrequency filter exploits the difference between induced interfering signals on a cable and the desired differential signals carried on it.

In some embodiments of the present invention, the radiofrequency filter uses small capacitances, either lumped or printed, to act in concert with the inductance of the common mode choke to affect a low pass filter to the common mode signals on the cable.

In some embodiments of the present invention, the radiofrequency filter uses tightly coupled bifilar windings to contain desired differential data between the conductor pair and is less susceptible to external common influence such as a ferrite core.

In some embodiments of the present invention, the radiofrequency filter has multiple choked paths for each differential data signal line.

To ensure that the radiofrequency filter provides not only the necessary filtering capabilities but also is properly shielded when attached to a radiofrequency shielded enclosure, for example, a novel shielded assembly is employed, as will be further described by way of FIGS. 9-26. The enclosure is made from a conductive material such as aluminum, steel copper or the like, and may be machined, cast, pressed, or otherwise fabricated.

Figure 9:
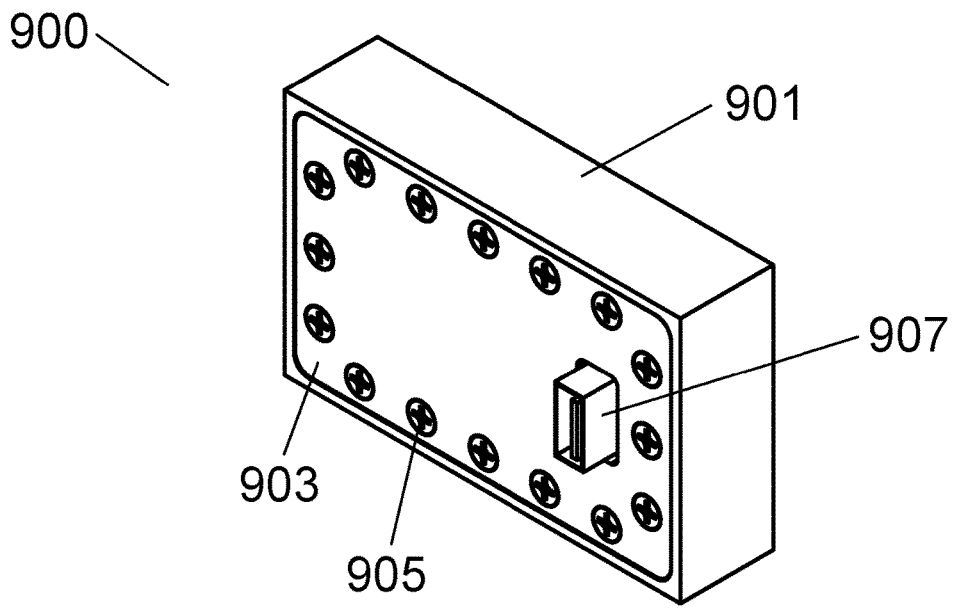
FIG. 9 is a perspective view of the radiofrequency filter assembly of the present invention.

FIG. 9 is a perspective view of the radiofrequency filter assembly 900 of the present invention with the unit closed and ready for use. A housing 901 can be seen, which will be further described in later views, which contains the RF filter circuit board and related connectors and fixturing. A cover plate can be seen fastened to, and recessed with, the housing 901. The cover plate 903 has a plurality of fasteners 905, such as screws, bolts, rivets, or the like, fastened therethrough. The fasteners 905 may, for example, be screws or bolts that are placed through holes in the cover plate 903, inserted into threaded holes in the housing 901, and tightened appropriately. Also, from this view a connector, such as a USB connector (connector out), can be seen protruding through the cover plate 903 with a corresponding opening in the cover plate 903 and, optionally, RF shielded gasketing material placed there between.

Figure 10:
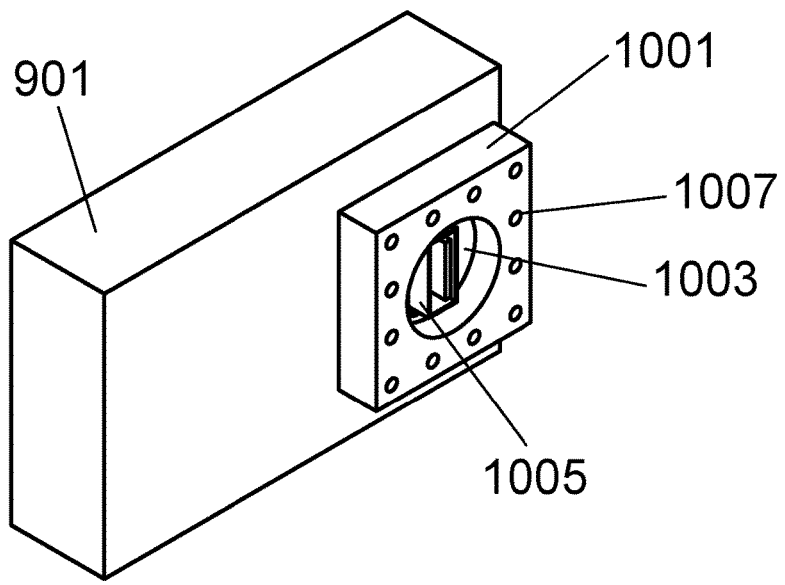
FIG. 10 is a rotated perspective view of the radiofrequency filter assembly of the present invention.

Now viewing the opposite side of the radiofrequency filter assembly, FIG. 10 is a rotated perspective view of the radiofrequency filter assembly of the present invention. Again, the housing 901 can be seen. A flange 1001 or similar structure can be seen protruding from the housing 901 and containing a connector such as the USB connector (connector in) 1005. The flange 1001 is machined, formed, or otherwise conductively fastened to the housing 901 for electrical continuity and effective shielding. In a preferred, but not limiting, embodiment of the present invention, the flange 1001 is machined with the housing 901 to create one integral part with no concern over loss of shielding effectiveness due to disparate or failing separate components. The flange 1001 can be seen in a rectangular, perhaps square, geometry, but other shapes may also be employed. A recess 1003 such as the circular recess depicted in FIG. 10 can be seen, and in which a connector such as the USB connector 1005 is surrounded or otherwise there within. The connector 1005 is in turn connected to the internal RF filter circuit board that will be seen in subsequent drawings, and protrudes through the housing 901 with a correspondingly shaped opening. Again, RF gasketing or shielding material may be employed between the connecter 1005 and the housing 901 to further shield at the boundary between connector body and housing, if necessary. A series of threaded holes or insets 1007 can be seen around the periphery of the flange 1001 to allow the radiofrequency filter assembly 900 to mate with a shielded enclosure through, for example, a shielded plate or pass through arrangement. Hardware such as screws, bolts, or the like are then used to properly fasten the radiofrequency filter assembly 900 to a pass through plate, bulkhead, or the like. The flange 1001, in addition to providing a mounting structure, serves to shield and isolate the connector 1005 through its novel recessed and pass through arrangement.

Figure 11:
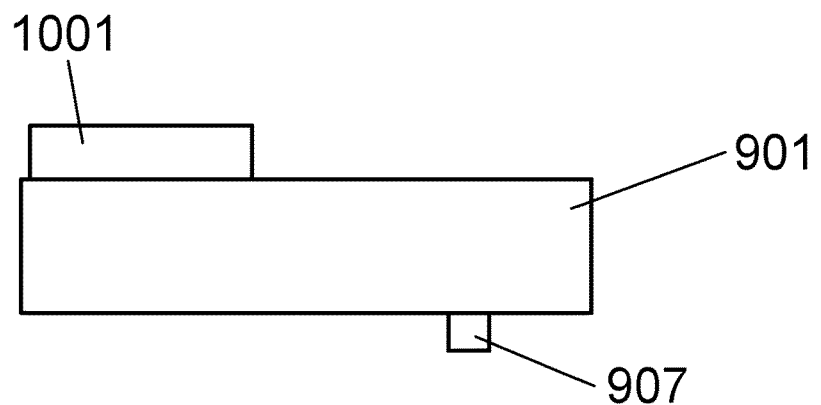
FIG. 11 is a side plan view of the radiofrequency filter assembly of the present invention.

FIG. 11 is a side plan view of the radiofrequency filter assembly of the present invention which shows the flange 1001 protruding from one side and a connector 907 (connector out) protruding from the other side. In some embodiments of the present invention, the connector 907 may also be surrounded by an recessed in a flange similar to the flange 1001 and connector 1005 arrangement previously described and depicted herein.

Figure 12:
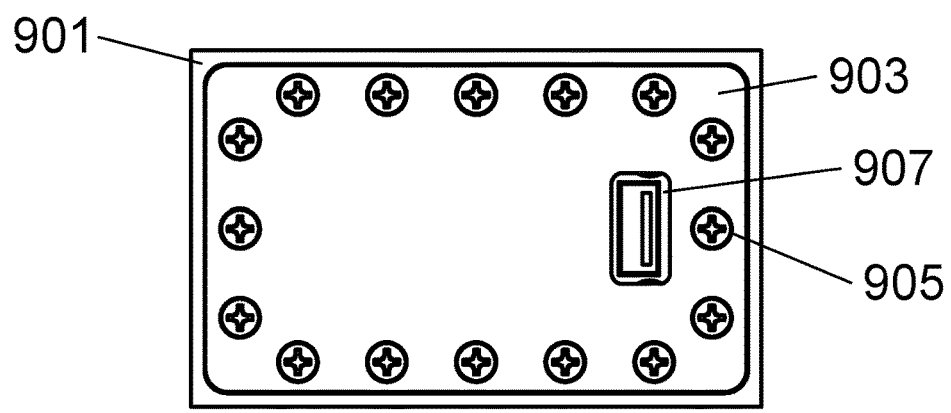
FIG. 12 is a top plan view of the radiofrequency filter assembly of the present invention.

FIG. 12 is a top plan view of the radiofrequency filter assembly of the present invention showing the cover plate 903 attached to the housing 901 with the filter circuit board contained within.

Figure 13:
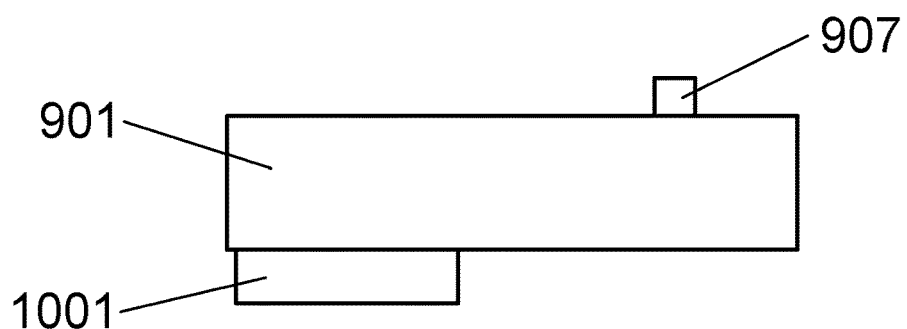
FIG. 13 is a rotated side plan view of the radiofrequency filter assembly of the present invention.

FIG. 13 is a rotated side plan view of the radiofrequency filter assembly of the present invention, rotated with respect to the opposing view depicted in FIG. 11.

Figures 14, 15:
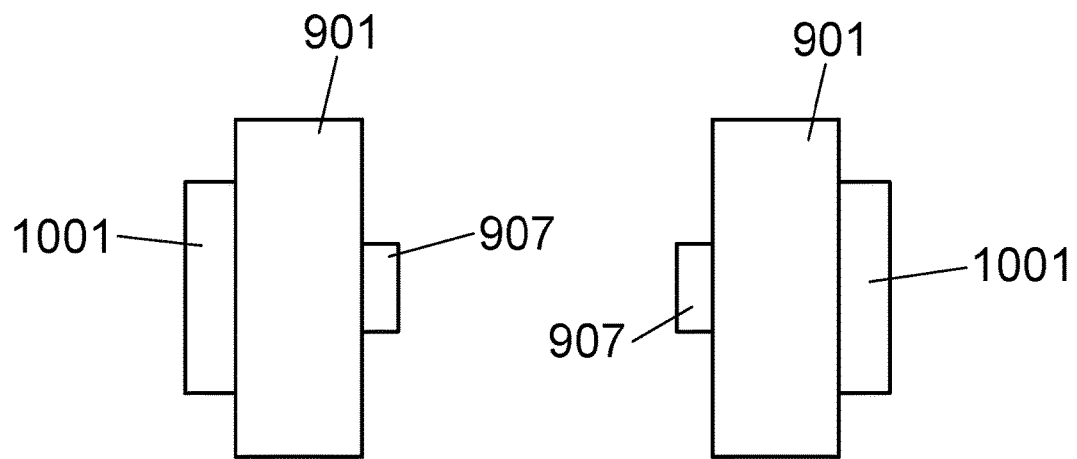
FIG. 14 is an end plan view of the radiofrequency filter assembly of the present invention.
FIG. 15 is a rotated end plan view of the radiofrequency filter assembly of the present invention.

FIG. 14 is an end plan view of the radiofrequency filter assembly of the present invention and FIG. 15 is a rotated end plan view of the radio-frequency filter assembly of the present invention.

Figure 16:
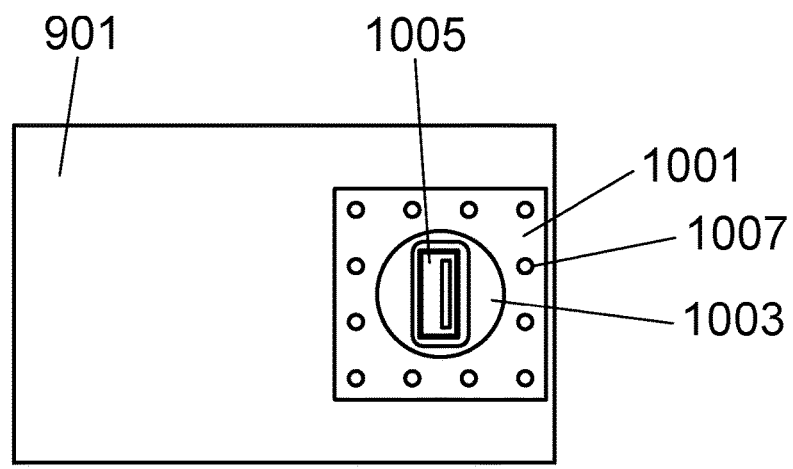
FIG. 16 is a bottom plan view of the radiofrequency filter assembly of the present invention.

Now turning to FIG. 16, a bottom plan view of the radiofrequency filter assembly of the present invention can be seen that clearly shows the connector 1005 recessed in and surrounded by the shielding flange 1001.

Figure 17:
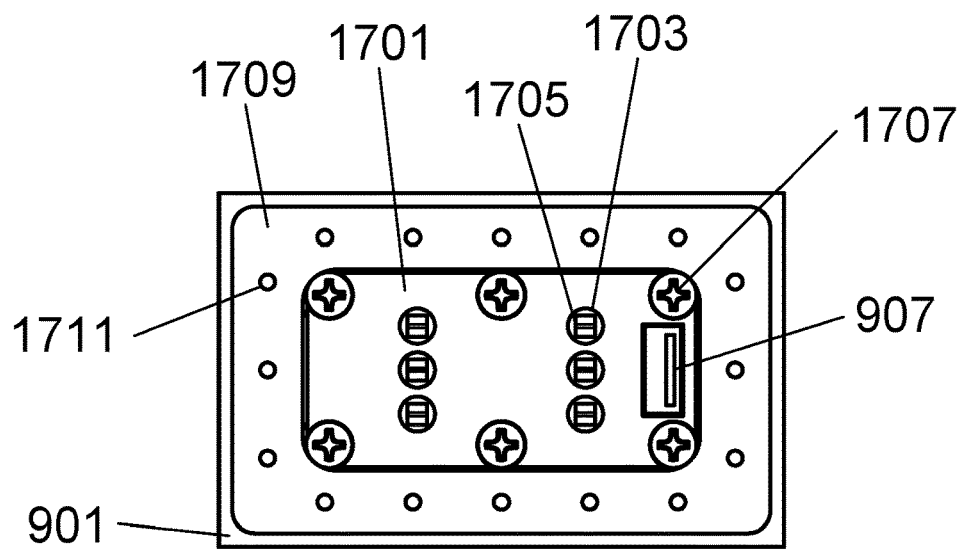
FIG. 17 is a view of the inside of the radiofrequency filter assembly of the present invention.

To completely describe the present invention, the inner workings of the Radiofrequency Filter wall be depicted and described further. FIG. 17 is a view of the inside of the radiofrequency filter assembly of the present invention with the cover plate removed. A radiofrequency circuit board 1701 can be seen mounted within the housing 901. The circuit board 1701 is attached to the housing 901 with fasteners 1707. The circuit board ground plane is also mechanically and electrically attached to the housing 901, in some instances with the fasteners 1707 being placed through a ground trace on the circuit board and making electrical contact with the ground trace or plane and then being mechanically fastened to the housing 901. The chokes 1705 that have previously been described herein can also be seen. In some embodiments of the present invention, the chokes 1705 are placed in an opening 1703 in the circuit board. To accommodate the cover plate, a cover plate recess or step 1709 can be seen. Such an arrangement provides improved radio-frequency shielding over simply fastening a cover plate to a housing. A plurality of threaded insets or holes 1711 can be seen around the perimeter of the cover plate recess 1709.

Figure 18:
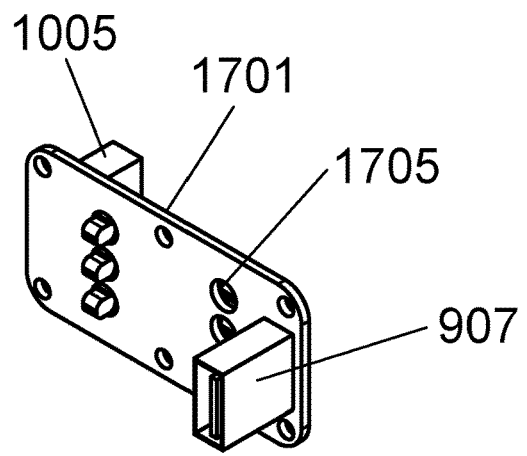
FIG. 18 is a perspective view of the circuit board of the radiofrequency filter assembly.

FIG. 18 is a perspective slew of the circuit board 1701 of the radiofrequency filter assembly. Both connectors 907 and 1005 can be seen at opposing sides of the circuit board. Further, chokes 1705 can be seen within openings in the circuit board 1701. In an exemplary embodiment of the present invention, the chokes are toroids with three chokes protruding more from a first side of the circuit board and three chokes protruding more from a second side of the circuit board.

Figure 19:
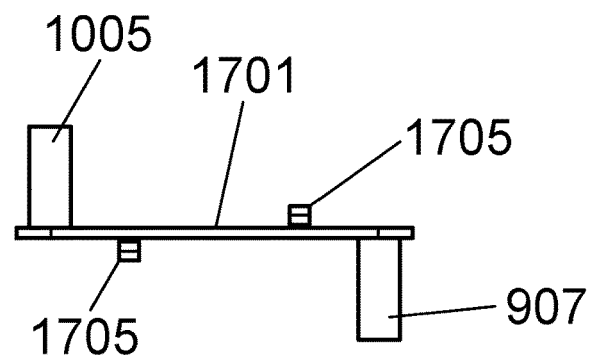
FIG. 19 is a side plan view of the circuit board of the radiofrequency filter assembly.

FIG. 19 is a side plan view of the circuit board of the radiofrequency filter assembly that clearly shows the protrusion of the chokes as previously described.

Figure 20:
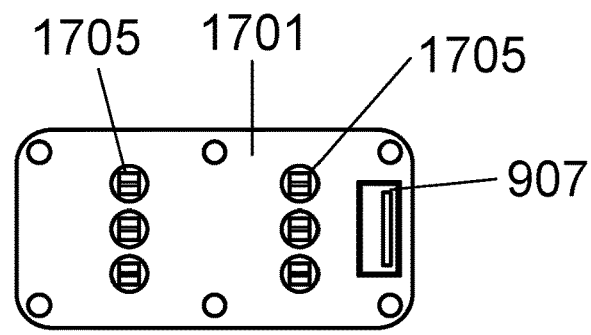
FIG. 20 is a top plan view of the circuit board of the radiofrequency filter assembly.

FIG. 20 is a top plan view of the circuit board of the radiofrequency filter assembly where the chokes 1705 can be seen within the openings 1703 of the circuit board.

Figure 21:
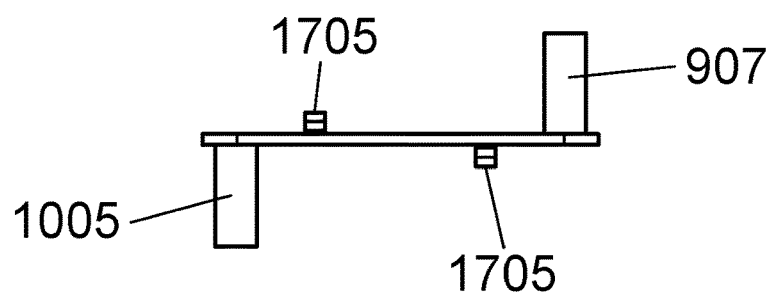
FIG. 21 is a rotated side plan view of the circuit board of the radiofrequency filter assembly.

FIG. 21 is a rotated side plan view of the circuit board of the radiofrequency filter assembly; rotated with respect to the view depicted in FIG. 19.

Figure 22:
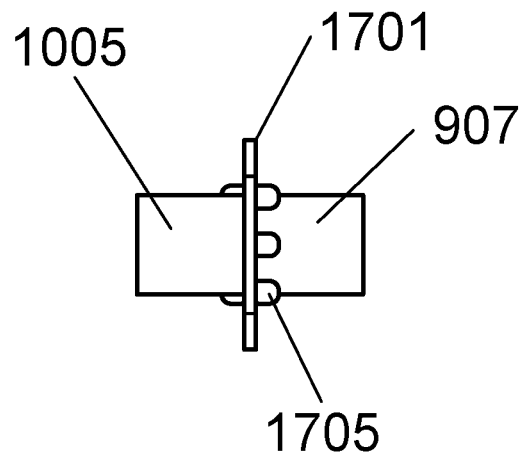
FIG. 22 is an end plan view of the circuit board of the radiofrequency filter assembly.
Figure 23:
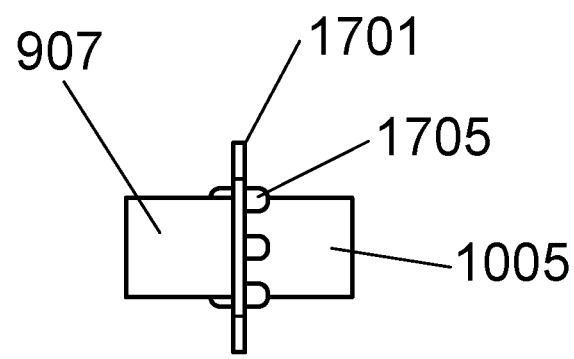
FIG. 23 is a rotated end plan view of the circuit board of the radiofrequency filter assembly.

FIG. 22 is an end plan view of the circuit board of the radiofrequency filter assembly and FIG. 23 is a rotated end plan view of the circuit board of the radiofrequency filter assembly.

Figure 24:
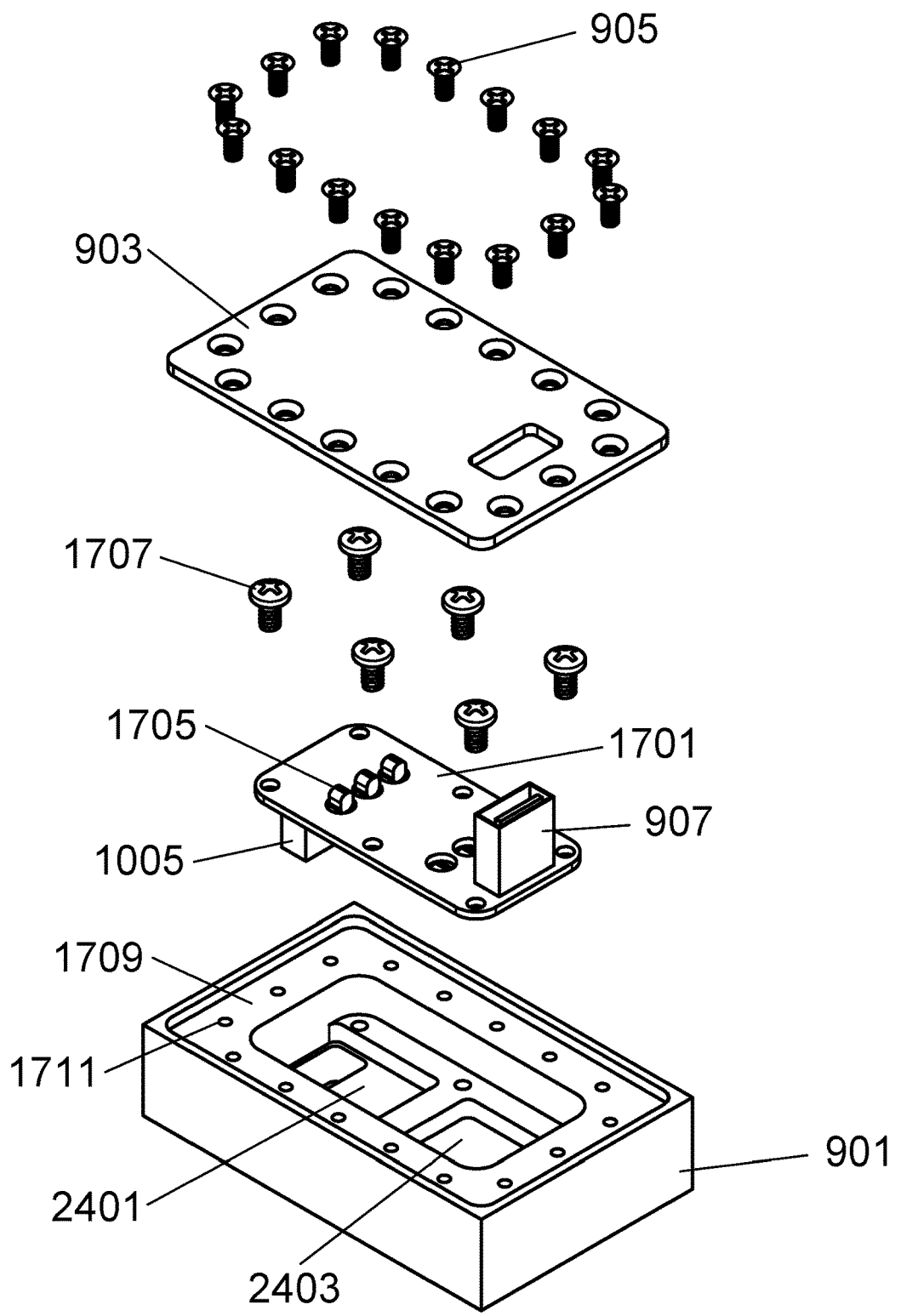
FIG. 24 is an exploded view of the radiofrequency filter assembly of the present invention.

FIG. 24 is an exploded view of the radiofrequency filter assembly of the present invention that shows how the circuit board is contained within the housing 901. It should be noted that in some embodiments of the present invention, chambering of the housing, such as the first chamber 2401 and the second chamber 2403 that are depicted in FIG. 24, is performed to not only provide adequate clearance for the chokes 1705 contained on the circuit board 1701, but also provide radiofrequency isolation between the chokes. The chambers are machined, pressed, cast or otherwise formed into the housing 901. Such chambering provides, for example, radiofrequency isolation between input and output, or the like.

Figure 25:
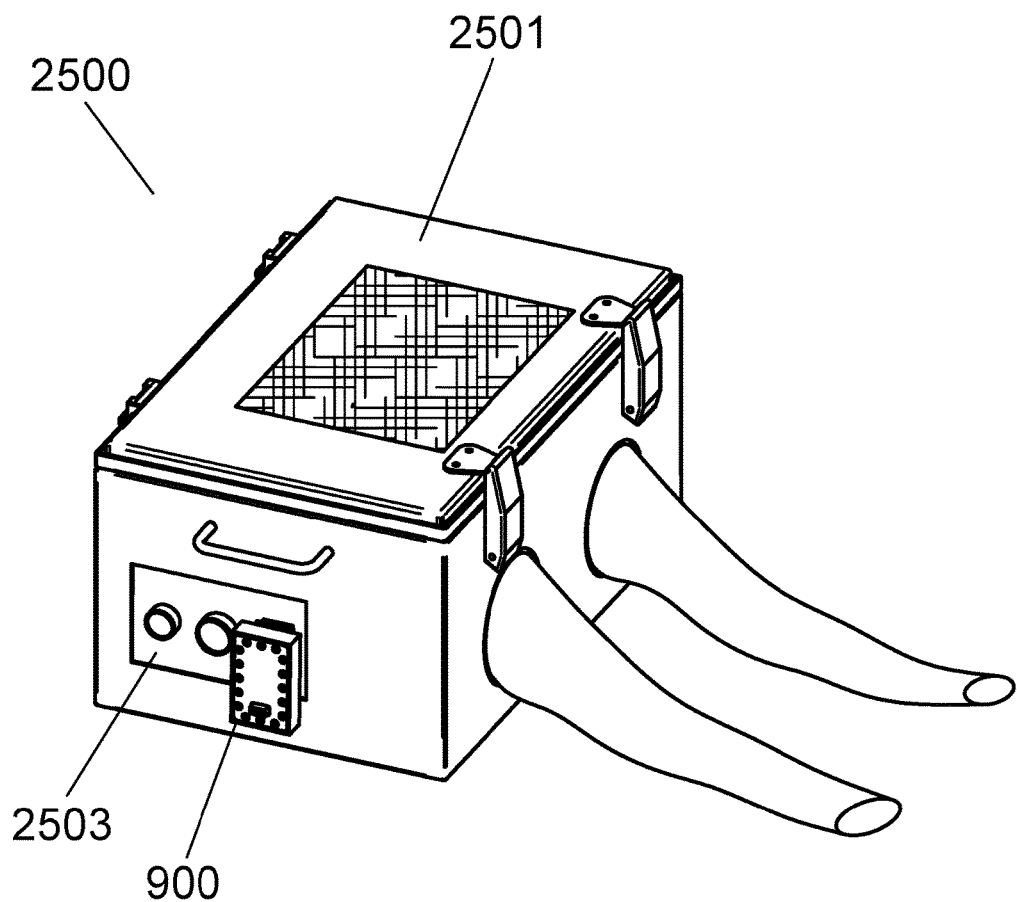
FIG. 25 is a perspective view of a test enclosure with the radiofrequency filter of the present invention attached.
Figure 26:
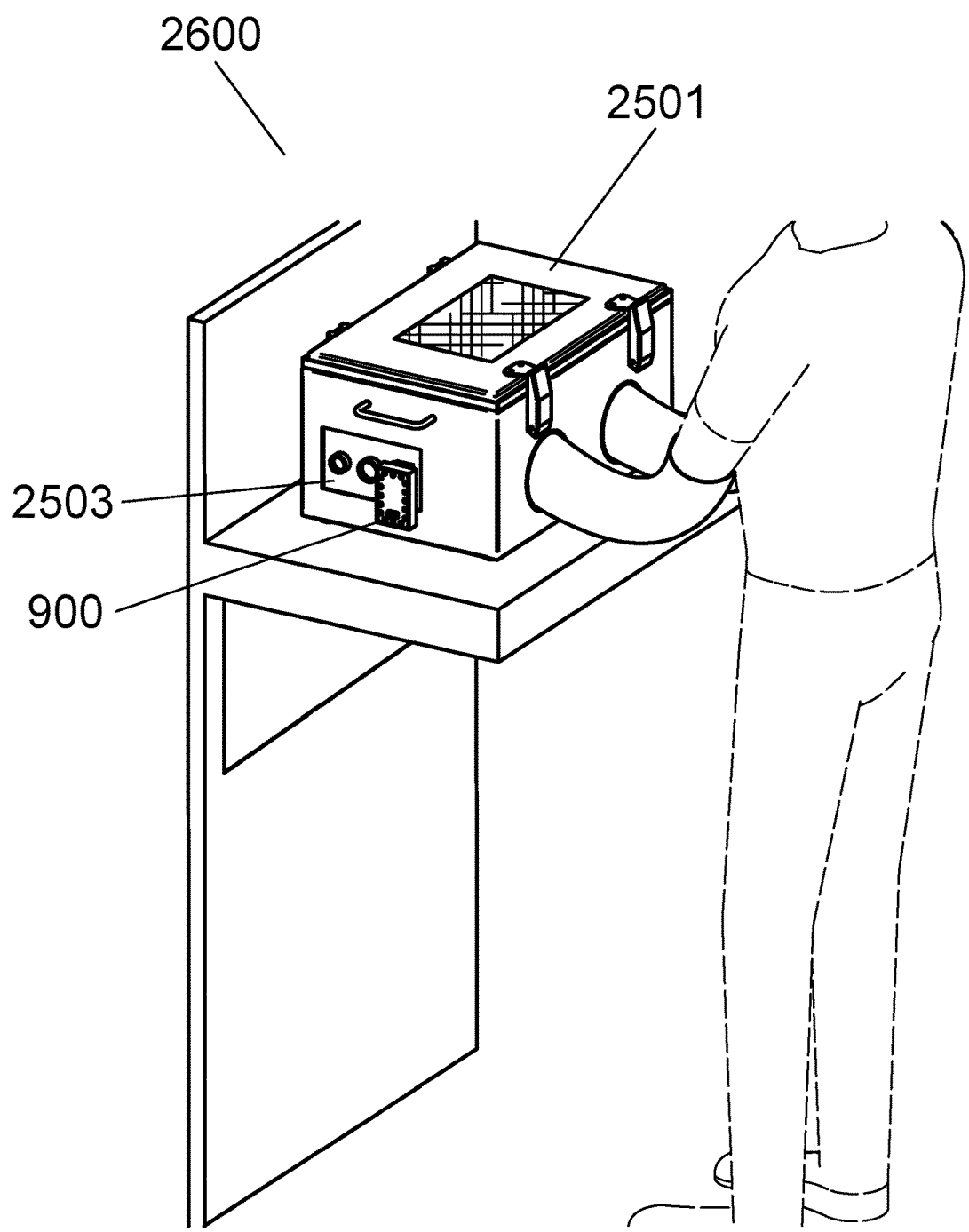
FIG. 26 illustrates the test enclosure with the radiofrequency filter of FIG. 25 in use.

To illustrate an example of the radiofrequency filter of the present invention in use, FIGS. 25 and 26 are provided. A shielded enclosure is depicted from Ramsey, U.S. Pat. No. 8,294,044, the entire disclosure of which is incorporated herein by reference. A variety of other shielded enclosures or shielding applications may also be used with the present invention, and the example provided in FIG. 25 should not be considered limiting, but rather, an example of a suitable application.

FIG. 25 is a perspective view of a test enclosure with the radiofrequency filter of the present invention attached. The test enclosure and radiofrequency filter assembly 2500 can be seen where the radiofrequency filter 900 is attached to a bulkhead, plate or connector pass through arrangement 2503. The flange 1001 (not seen in FIG. 25, see FIG. 10) is used in conjunction with fasteners to attach the radiofrequency filter to the test enclosure bulkhead plate or similar hardware. A mating flange plate, for example, may be used to ensure that the bolt pattern is met.

Lastly, FIG. 26 illustrates the test enclosure with the radiofrequency filter of FIG. 25 in use 2600. While typically cabling is attached to the connectors, such cabling has been omitted in FIG. 26 for clarity.

It is, therefore, apparent that there has been provided, in accordance with the various objects of the present invention, a radiofrequency filter with improved attenuation of common mode signals. While the various objects of this invention have been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of this specification, claims and drawings provided herein.

What is claimed is:

1. A radiofrequency filter circuit comprising:
 a first input terminal and a second input terminal;
 a first output terminal and a second output terminal;
 a first signal path between the first input terminal and the first output terminal;
 a second signal path between the second input terminal and the second output terminal;
 a first common mode choke having a first set of bifilar windings and a second set of bifilar windings and a second common mode choke having a first set of bifilar windings and a second set of bifilar windings where the first set of bifilar windings on the first common mode choke is in series with the first set of bifilar windings on the second common mode choke such that the first set of bifilar windings on the first common mode choke in series with the first set of bifilar windings on the second common mode choke are in the first signal path between the first input terminal and the first output terminal and where the second set of bifilar windings on the first common mode choke is in series with the second set of bifilar windings on the second common mode choke such that the second set of bifilar windings on the first common mode choke in series with the second set of bifilar windings on the second common mode choke are in the second signal path between the second input terminal and the second output terminal;
 a first capacitive structure in the first signal path between the first input terminal and the first output terminal and electrically connected at a point between the first set of bifilar windings on the first common mode choke and the first set of bifilar windings on the second common mode choke and ground;
 a second capacitive structure in the second signal path between the second input terminal and the second output terminal and electrically connected at a point between the second set of bifilar windings on the first common mode choke and the second set of bifilar windings on the second common mode choke and ground; and a third common mode choke having a first set of bifilar windings and a second set of bifilar windings where the first set of bifilar windings of the third common mode choke is connected in series with the first capacitive structure and the second set of bifilar windings of the third common mode choke is connected in series with the second capacitive structure.

2. The radiofrequency filter circuit of claim 1, wherein the first capacitive structure and the second capacitive structure are microstriplines comprising additional pad area.

3. The radiofrequency filter circuit of claim 1, wherein the bifilar windings on the first common mode choke and the bifilar windings on the second common mode choke present a nominal 90 ohm balanced line impedance.

4. The radiofrequency filter circuit of claim 1, wherein the first set of bifilar windings and the second set of bifilar windings for the first common mode choke are each wound with three turns around a core.

5. The radiofrequency filter circuit of claim 1, wherein the first set of bifilar windings and the second set of bifilar windings for the second common mode choke are each wound with three turns around a core.

6. The radiofrequency filter circuit of claim 1, wherein the first set of bifilar windings and the second set of bifilar windings for the third common mode choke are each wound with three turns around a core.

7. A universal serial bus (USB) filter circuit comprising:
 a first radiofrequency filter circuit, a second radiofrequency filter circuit and a third radiofrequency filter circuit;
 wherein each radiofrequency filter circuit comprises:
 a first input terminal and a second input terminal;
 a first output terminal and a second output terminal;
 a first signal path between the first input terminal and the first output terminal;
 a second signal path between the second input terminal and the second output terminal;
 a first common mode choke having a first set of bifilar windings and a second set of bifilar windings and a second common mode choke having a first set of bifilar windings and a second set of bifilar windings where the first set of bifilar windings on the first common mode choke is in series with the first set of bifilar windings on the second common mode choke such that the first set of bifilar windings on the first common mode choke in series with the first set of bifilar windings on the second common mode choke are in the first signal path between the first input terminal and the first output terminal and where the second set of bifilar windings on the first common mode choke is in series with the second set of bifilar windings on the second common mode choke such that the second set of bifilar windings on the first common mode choke in series with the second set of bifilar windings on the second common mode choke are in the second signal path between the second input terminal and the second output terminal;
 a first capacitive structure in the first signal path between the first input terminal and the first output terminal and electrically connected at a point between the first set of bifilar windings on the first common mode choke and the first set of bifilar windings on the second common mode choke and ground;
 a second capacitive structure in the second signal path between the second input terminal and the second output terminal and electrically connected at a point between the second set of bifilar windings on the first common mode choke and the second set of bifilar windings on the second common mode choke and ground; and
 a third common mode choke having a first set of bifilar windings and a second set of bifilar windings where the first set of bifilar windings of the third common mode choke is connected in series with the first capacitive structure and the second set of bifilar windings of the third common mode choke is connected in series with the second capacitive structure.

8. The universal serial bus (USB) filter circuit of claim 7, wherein the first set of bifilar windings and the second set of bifilar windings for the third common mode choke are each wound with three turns around a core.

9. The universal serial bus (USB) filter circuit of claim 7, wherein the first capacitive structure and the second capacitive structure are microstriplines comprising additional pad area.

10. The universal serial bus (USB) filter circuit of claim 7, wherein the bifilar windings on the first common mode choke and the bifilar windings on the second common mode choke present a nominal 90 ohm balanced line impedance.

11. The universal serial bus (USB) filter circuit of claim 7, wherein the first set of bifilar windings and the second set of bifilar windings for the first common mode choke are each wound with three turns around a core.

12. The universal serial bus (USB) filter circuit of claim 7, wherein the first set of bifilar windings and the second set of bifilar windings for the second common mode choke are each wound with three turns around a core.

13. A radiofrequency filter circuit comprising:
 a first input terminal and a second input terminal;
 a first output terminal and a second output terminal;
 a first signal path between the first input terminal and the first output terminal;
 a second signal path between the second input terminal and the second output terminal;
 a first common mode choke having a first set of bifilar windings and a second set of bifilar windings and a second common mode choke having a first set of bifilar windings and a second set of bifilar windings where the first set of bifilar windings on the first common mode choke is in series with the first set of bifilar windings on the second common mode choke such that the first set of bifilar windings on the first common mode choke in series with the first set of bifilar windings on the second common mode choke are in the first signal path between the first input terminal and the first output terminal and where the second set of bifilar windings on the first common mode choke is in series with the second set of bifilar windings on the second common mode choke such that the second set of bifilar windings on the first common mode choke in series with the second set of bifilar windings on the second common mode choke are in the second signal path between the second input terminal and the second output terminal;
 a first capacitive structure in the first signal path between the first input terminal and the first output terminal and electrically connected at a point between the first set of bifilar windings on the first common mode choke and the first set of bifilar windings on the second common mode choke and ground;
 a second capacitive structure in the second signal path between the second input terminal and the second output terminal and electrically connected at a point between the second set of bifilar windings on the first common mode choke and the second set of bifilar windings on the second common mode choke and ground;

a third common mode choke having a first set of bifilar windings and a second set of bifilar windings where the first set of bifilar windings of the third common mode choke is connected in series with the first capacitive structure and the second set of bifilar windings of the third common mode choke is connected in series with the second capacitive structure;

a radiofrequency shielded housing to contain the radiofrequency filter circuit;

a cover plate to enclose the radiofrequency filter circuit in the radiofrequency shielded housing;

an input connector electrically connected to the first input terminal and the second input terminal; and an output connector electrically connected to the first output terminal and the second output terminal.

14. The radiofrequency filter circuit of claim 13, wherein the input connector and the output connector are USB connectors.

15. The radiofrequency filter circuit of claim 13, further comprising an electromagnetically shielded test enclosure mechanically and electromagnetically coupled to the radiofrequency filter circuit.

16. The radiofrequency filter circuit of claim 13, further comprising a flange with a recess to surround the output connector.

17. The radiofrequency filter circuit of claim 16, wherein the flange has a plurality of threaded insets for receiving threaded fasteners.

18. The radiofrequency filter circuit of claim 13, wherein the radiofrequency shielded housing has a recess to retain the cover plate and provide a radiofrequency tight seal.

* * * * *